(12) United States Patent
Huai et al.

(10) Patent No.: US 7,126,202 B2
(45) Date of Patent: Oct. 24, 2006

(54) SPIN SCATTERING AND HEAT ASSISTED SWITCHING OF A MAGNETIC ELEMENT

(75) Inventors: Yiming Huai, Pleasanton, CA (US); Mahendra Pakala, Fremont, CA (US)

(73) Assignee: Grandis, Inc., Milpitas, CA (US)

( * ) Notice: Subject to any disclaimer, the term of this patent is extended or adjusted under 35 U.S.C. 154(b) by 15 days.

(21) Appl. No.: 10/990,561

(22) Filed: Nov. 16, 2004

(65) Prior Publication Data

US 2006/0102969 A1    May 18, 2006

(51) Int. Cl.
*H01L 29/82* (2006.01)

(52) U.S. Cl. ............... 257/421; 257/421; 257/E27.005; 257/E43.001

(58) Field of Classification Search ................ 257/295, 257/421, E43.001, E27.005
See application file for complete search history.

(56) References Cited

U.S. PATENT DOCUMENTS

| | | | |
|---|---|---|---|
| 5,695,864 A | | 12/1997 | Slonczewski |
| 6,700,753 B1 * | | 3/2004 | Singleton et al. ........ 360/324.1 |
| 6,838,740 B1 * | | 1/2005 | Huai et al. .................. 257/421 |
| 2005/0180202 A1 * | | 8/2005 | Huai et al. .................. 365/171 |

OTHER PUBLICATIONS

Geoff Anderson, et al., "CoFe/IrMn Exchange Biased Top, Bottom, and Dual Spin Valves", Journal of Applied Physics, vol. 87, No. 9, p. 6989-6991, (May 1, 2000).
Ki-Seok Moon, et al., "PtMn-Based Spin-Dependent Tunneling Materials with Thin Alumina Barrier Fabricated by Two-Step Natural Oxidation", Journal of Applied Physics, vol. 91, No. 10, p. 7986-7967, (May 15, 2002).
Kebin Li, et al., "Abnormal Temperature Dependence of Exchange Bias in the NiFe5/Ta0.2/InMn8 System", Journal of Applied Physics, vol. 93, No. 10, p. 6614-6616 (May 15, 2003).
Minn-Tsong Lin, et al., "Thermally Assisted Oscillatory Interlayer Exchange Bias Coupling", Physical Review, B, vol. 63, p. 100404-1-4 (2001).
J.A. Katine, et al., "Current Driven Magnetization Reversal and Spin-Wave Excitations in Co/Cu/Co Pillars", Physical Review Letters, vol. 84, No. 14, p. 3149-3152 (Apr. 3, 2000).
L. Berger, *Emission of spin waves by a magnetic multilayer traversed by a current*, The American Physical Society, Physical Review B, vol. 54, No. 13, Oct. 1996, pp. 9353-9358.
J.C. Slonczewski, *Current-driven excitation of magnetic multilayers*, Journal of Magnetism and Magnetic Materials, vol. 159, 1996, pp. L1-L7.
F.J. Albert, et al., *Spin-polarized current switching of a Co thin film nanomagnet*, Applied Physics Letters, vol. 77, No. 23, Dec. 2000, pp. 3809-3811.

* cited by examiner

*Primary Examiner*—Andy Huynh
(74) *Attorney, Agent, or Firm*—Sawyer Law Group LLP (57) ABSTRACT

A method and system for providing a magnetic element is disclosed. The magnetic element include providing a pinned layer, a spacer layer, and a free layer. The method and system also include providing a heat assisted switching layer and a spin scattering layer between the free layer and the heat assisted switching layer. The spin scattering layer is configured to more strongly scatter majority electrons than minority electrons. The heat assisted switching layer is for improving a thermal stability of the free layer when the free layer is not being switched. Moreover, the magnetic element is configured to allow the free layer to be switched due to spin transfer when a write current is passed through the magnetic element.

19 Claims, 7 Drawing Sheets

SPIN SCATTERING AND HEAT ASSISTED SWITCHING OF A MAGNETIC ELEMENT

FIELD OF THE INVENTION

The present invention relates to magnetic memory systems, and more particularly to a method and system for providing a more thermally stable magnetic element that employs a spin transfer effect in switching, and that can be used in a magnetic memory such as magnetic random access memory ("MRAM").

BACKGROUND OF THE INVENTION

Figure 1A:
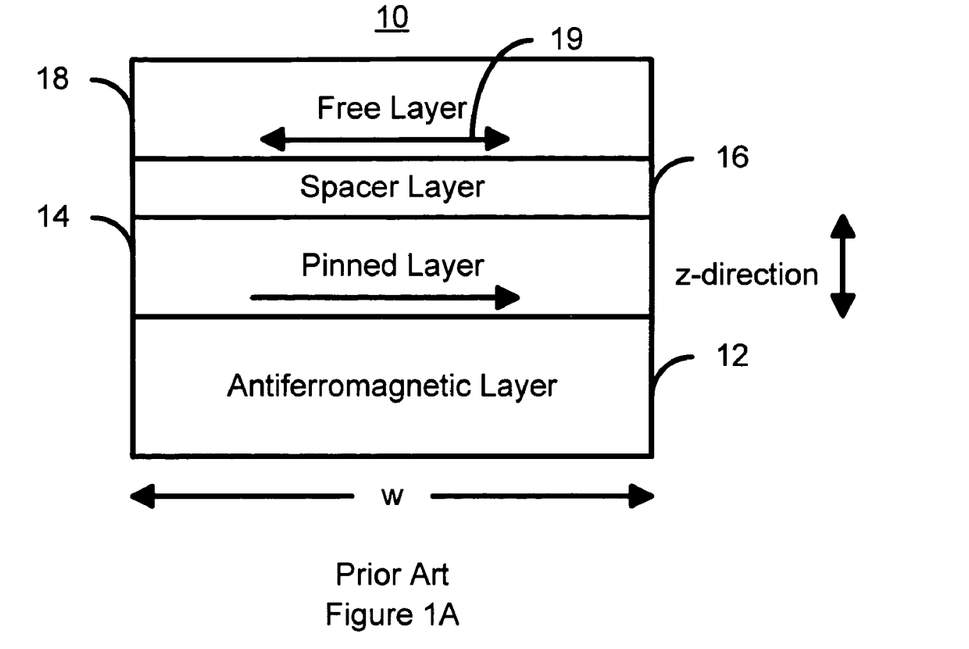
FIG. 1A is a diagram of a conventional magnetic element, a spin valve.
Figure 1B:
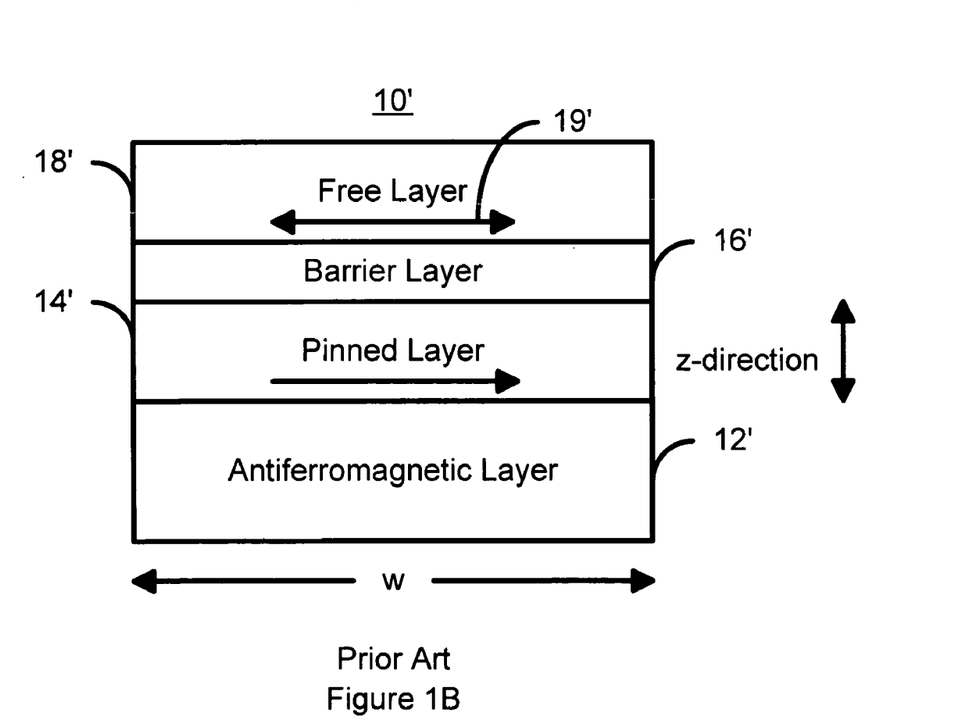
FIG. 1B is a diagram of another conventional magnetic element, a spin tunneling junction

FIGS. 1A and 1B depict conventional magnetic elements 10 and 10'. The conventional magnetic element 10 is a spin valve and includes a conventional antiferromagnetic (AFM) layer 12, a conventional pinned layer 14, a conventional nonmagnetic spacer layer 16 and a conventional free layer 18. Other layers (not shown), such as seed or capping layer may also be used. The conventional pinned layer 14 and the conventional free layer 18 are ferromagnetic. Thus, the conventional free layer 18 is depicted as having a changeable magnetization 19. The conventional nonmagnetic spacer layer 16 is conductive. The AFM layer 12 is used to fix, or pin, the magnetization of the pinned layer 14 in a particular direction. The magnetization of the free layer 18 is free to rotate, typically in response to an external magnetic field. The conventional magnetic element 10' depicted in FIG. 1B is a spin tunneling junction. Portions of the conventional spin tunneling junction 10' are analogous to the conventional spin valve 10. Thus, the conventional magnetic element 10' includes an AFM layer 12', a conventional pinned layer 14', a conventional insulating barrier layer 16' and a conventional free layer 18' having a changeable magnetization 19'. The conventional barrier layer 16' is thin enough for electrons to tunnel through in a conventional spin tunneling junction 10'.

Depending upon the orientations of the magnetization 19/19' of the conventional free layer 18/18' and the conventional pinned layer 14/14', respectively, the resistance of the conventional magnetic element 10/10', respectively, changes. When the magnetization 19/19' of the conventional free layer 18/18' is parallel to the magnetization of the conventional pinned layer 14/14', the resistance of the conventional magnetic element 10/10' is low. When the magnetization 19/19' of the conventional free layer 18/18' is antiparallel to the magnetization of the conventional pinned layer 14/14', the resistance of the conventional magnetic element 10/10' is high.

To sense the resistance of the conventional magnetic element 10/10', current is driven through the conventional magnetic element 10/10'. Typically in memory applications, current is driven in a CPP (current perpendicular to the plane) configuration, perpendicular to the layers of conventional magnetic element 10/10' (up or down, in the z-direction as seen in FIG. 1A or 1B).

In order to overcome certain issues associated with magnetic memories having a higher density of memory cells, spin transfer may be utilized to switch the magnetizations 19/19' of the conventional free layers 10/10'. Spin transfer is described in the context of the conventional magnetic element 10', but is equally applicable to the conventional magnetic element 10. Current knowledge of spin transfer is described in detail in the following publications: J. C. Slonczewski, "Current-driven Excitation of Magnetic Multilayers," *Journal of Magnetism and Magnetic Materials*, vol. 159, p. L1 (1996); L. Berger, "Emission of Spin Waves by a Magnetic Multilayer Traversed by a Current," *Phys. Rev. B, vol.* 54, p. 9353 (1996), and F. J. Albert, J. A. Katine and R. A. Buhrman, "Spin-polarized Current Switching of a Co Thin Film Nanomagnet," *Appl. Phys. Lett., vol.* 77, No. 23, p. 3809 (2000). Thus, the following description of the spin transfer phenomenon is based upon current knowledge and is not intended to limit the scope of the invention.

When a spin-polarized current traverses a magnetic multilayer such as the spin tunneling junction 10' in a CPP configuration, a portion of the spin angular momentum of electrons incident on a ferromagnetic layer may be transferred to the ferromagnetic layer. In particular, electrons incident on the conventional free layer 18' may transfer a portion of their spin angular momentum to the conventional free layer 18'. As a result, a spin-polarized current can switch the magnetization 19' direction of the conventional free layer 18' if the current density is sufficiently high (approximately $10^7$–$10^8$ A/cm$^2$) and the lateral dimensions of the spin tunneling junction are small (approximately less than two hundred nanometers). In addition, for spin transfer to be able to switch the magnetization 19' direction of the conventional free layer 18', the conventional free layer 18' should be sufficiently thin, for instance, preferably less than approximately ten nanometers for Co. Spin transfer based switching of magnetization dominates over other switching mechanisms and becomes observable when the lateral dimensions of the conventional magnetic element 10/10' are small, in the range of few hundred nanometers. Consequently, spin transfer is suitable for higher density magnetic memories having smaller magnetic elements 10/10'.

The phenomenon of spin transfer can be used in the CPP configuration as an alternative to or in addition to using an external switching field to switch the direction of magnetization of the conventional free layer 18' of the conventional spin tunneling junction 10'. For example, the magnetization 19' of the conventional free layer 18' can be switched from antiparallel to the magnetization of the conventional pinned layer 14' to parallel to the magnetization of the conventional pinned layer 14'. Current is driven from the conventional free layer 18' to the conventional pinned layer 14' (conduction electrons traveling from the conventional pinned layer 14' to the conventional free layer 18'). The majority electrons traveling from the conventional pinned layer 14' have their spins polarized in the same direction as the magnetization of the conventional pinned layer 14'. These electrons may transfer a sufficient portion of their angular momentum to the conventional free layer 18' to switch the magnetization 19' of the conventional free layer 18' to be parallel to that of the conventional pinned layer 14'. Alternatively, the magnetization of the free layer 18' can be switched from a direction parallel to the magnetization of the conventional pinned layer 14' to antiparallel to the magnetization of the conventional pinned layer 14'. When current is driven from the conventional pinned layer 14' to the conventional free layer 18' (conduction electrons traveling in the opposite direction), majority electrons have their spins polarized in the direction of magnetization of the conventional free layer 18'. These majority electrons are transmitted by the conventional pinned layer 14'. The minority electrons are reflected from the conventional pinned layer 14', return to the conventional free layer 18' and may transfer a sufficient amount of their angular momentum to switch the magnetization 19' of the free layer 18' antiparallel to that of the conventional pinned layer 14'.

Although spin transfer functions, one of ordinary skill in the art will readily recognize that thermal stability of the magnetization 19 and 19' of the free layer 18 and 18', respectively, becomes an issue at smaller sizes of the conventional magnetic element 10 and 10', respectively (smaller bit sizes). The free layer 18 or 18' stores data. The directions of the magnetization 19 and 19' of the free layer 18 and 18', can typically assume either of the two directions along an easy axis (i.e. right or left as shown in FIGS. 1A and 1B). The thermal stability of stored data, that is the ability of the free layer to maintain the direction of magnetization in the quiescent state, depends on an energy barrier (E) between the two directions along the easy axis of magnetization. If the energy barrier is low, then the magnetization direction can be switched inadvertently by thermal assisted magnetization reversal. For the conventional free layers 18 and 18', the energy barrier, E, is given by $$E \propto H_k V/2$$

In the representation of E above, $H_k$ is the uni-axial anisotropy in the plane of the free layer 18 or 18' (the magnetic thin films used for the storage layer) and V is the volume of the free layer 18 or 18'. For a fixed $H_k$, at smaller bit sizes (higher density storage), the volume of the free layer 18 or 18' and, therefore, the energy barrier decreases. Consequently, the direction of the magnetization 19 or 19' can more readily flip unintentionally, due to thermal fluctuations. Stated differently, for a fixed $H_k$, the magnetizations 19 and 19' are less thermally stable for smaller sizes of the conventional magnetic elements 10 and 10', respectively.

The poor thermal stability of the conventional magnetic elements 10 and 10' at smaller sizes adversely affects the ability of the conventional magnetic elements 10 and 10' to be used in higher density applications, such as high density MRAM. In particular, as the density of the MRAM increases, the size of the magnetic elements used in storing information in each MRAM cell is generally desired to decrease. Because smaller conventional magnetic elements 10 and 10' are not thermally stable, these conventional magnetic elements 10 and 10' may not be suitable for use in higher density MRAM applications.

Accordingly, what is needed is a system and method for providing a magnetic memory element that can be switched using spin transfer and that has improved thermal stability during operation. Further, to integrate a spin transfer switchable magnetic cell with the transistor base, it is desirable to lower the switching current density to values lower than $10^6$–$10^7$ A/cm$^2$ presently achievable. The present invention addresses also such a need.

BRIEF SUMMARY OF THE INVENTION

The present invention provides a method and system for providing a magnetic element. The method and system include providing a pinned layer, a spacer layer, and a free layer. The method and system also include providing a heat assisted switching layer and a spin scattering layer between the free layer and the heat assisted switching layer. The spin scattering layer is configured to more strongly scatter majority electrons than minority electrons. The heat assisted switching layer is for improving a thermal stability of the free layer when the free layer is not being switched. Moreover, the magnetic element is configured to allow the free layer to be switched due to spin transfer when a write current is passed through the magnetic element.

According to the method and system disclosed herein, the present invention provides a magnetic element that is more thermally stable, and need not use a higher current to be written using spin transfer.

DETAILED DESCRIPTION OF THE INVENTION

The present invention relates to magnetic elements and magnetic memories such as MRAM. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

The present invention provides a method and system for providing a magnetic element. The method and system include providing a pinned layer, a spacer layer, and a free layer. The method and system also include providing a heat assisted switching layer and a spin scattering layer between the free layer and the heat assisted switching layer. The spin scattering layer is configured to more strongly scatter majority electrons than minority electrons. The heat assisted switching layer is for improving a thermal stability of the free layer when the free layer is not being switched. Moreover, the magnetic element is configured to allow the free layer to be switched due to spin transfer when a write current is passed through the magnetic element.

The present invention will be described in terms of a particular magnetic memory and a particular magnetic element having certain components. However, one of ordinary skill in the art will readily recognize that this method and system will operate effectively for other magnetic memory elements having different and/or additional components and/or other magnetic memories having different and/or other features not inconsistent with the present invention. The present invention is also described in the context of current understanding of the spin transfer phenomenon. Consequently, one of ordinary skill in the art will readily recognize that theoretical explanations of the behavior of the method and system are made based upon this current understanding of spin transfer. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the present invention is described in the context of magnetic elements having particular layers. However, one of ordinary skill in the art will readily recognize that magnetic elements having additional and/or different layers not inconsistent with the present invention could also be used. Moreover, certain components are described as being ferromagnetic. However, as used herein, the term ferromagnetic could include ferrimagnetic or like structures. Thus, as used herein, the term "ferromagnetic" includes, but is not limited to ferromagnets and ferrimagnets. The present invention is also described in the context of single elements. However, one of ordinary skill in the art will readily recognize that the present invention is consistent with the use of magnetic memories having multiple elements, bit lines, and word lines.

Figure 2:
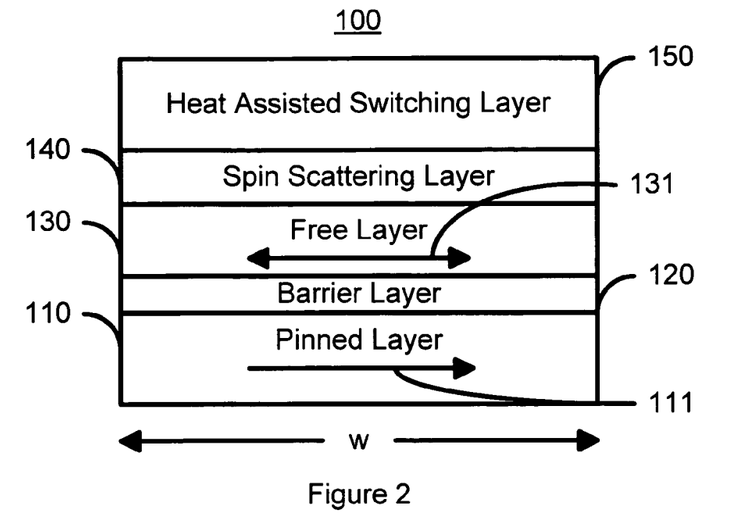
FIG. 2 depicts one embodiment of a portion of a magnetic element in accordance with the present invention utilizing heat assisted switching.

To more particularly illustrate the method and system in accordance with the present invention, refer now to FIG. 2, depicting one embodiment of a portion of the magnetic element 100 in accordance with the present invention utilizing heat assisted switching. The magnetic element 100 is preferably used in a magnetic memory, such as a MRAM. Thus, the magnetic element 100 may be used in a memory cell including an isolation transistor (not shown), as well as other configurations of magnetic memories. Moreover, the magnetic element 100 preferably utilizes two terminals (not shown) near the top and bottom of the magnetic element. The magnetic element 100 includes a pinned layer 110, a spacer layer 120, a free layer 130, a spin scattering layer 140, and a heat assisted switching layer 150. The magnetic element 100 generally also includes an AFM layer (not shown) used to pin the magnetization 111 of the pinned layer 110, as well as seed layers (not shown) and capping layers (not shown). Furthermore, the magnetic element 100 is configured such that the free layer 130 can be written using spin transfer. In a preferred embodiment, the lateral dimensions, such as the width w, of the free layer 130 are thus small and preferably less than two hundred nanometers. In addition, some difference is preferably provided between the lateral dimensions to ensure that the free layer 130 has a particular easy axis.

The free layer 130 is ferromagnetic and preferably includes magnetic alloy containing at least one of elements Co, Fe or Ni. The free layer 130 may be a simple free layer, for example containing a single material or an alloy of multiple materials. In an alternate embodiment, the free layer 130 may have another structure, such as a synthetic free layer including ferromagnetic layers (not shown) separated by nonmagnetic spacer layers, such as Ru. In a preferred embodiment, the ferromagnetic free layer 130 includes Co, CoFe, CoFeB or a bilayer (layers of the bilayer not separately depicted in FIG. 2) such as NiFe/CoFe.

The pinned layer 110 is also ferromagnetic. In a preferred embodiment, described below, the pinned layer 110 is synthetic. In such an embodiment, the pinned layer 110 includes ferromagnetic layers separated by nonmagnetic layers and is configured such that the ferromagnetic layers are aligned antiparallel. The spacer layer 120 is nonmagnetic. The spacer layer 120 is preferably a barrier layer including an insulator such as alumina or $MgO_x$, where x is between 0.3 and 0.7. In such an embodiment, the barrier layer 120 is preferably less than two nanometers thick for alumina and less than three nanometers thick for $MgO_x$, such that charge carriers can tunnel between the free layer 130 and the pinned layer 110. In case of $MgO_x$ barrier, to further enhance spin transfer effect, the pinned layer, spacer layer and the free layer are highly textured, with a particular crystal structure for each of the layers and a preferred orientation relationship between the layers. The preferred crystal structure and texture for the pinned and free layers (in case of synthetic pinned or free layer, the sub-layer closest to the $MgO_x$ barrier are the relevant layers) is Body Centered Cubic (A2 or B2 structure) with the (001) planes parallel to the film plane. The crystal structure and preferred texture for MgO is Cubic (prototype structure is NaCl) with (001) planes parallel to the film plane. Thus an orientation relationship PL-BCC(001)/MgO-Cubic(001)/FL-BCC(001) is preferred.

The heat assisted switching layer 150 is configured such that a magnetic coupling between the free layer 130 and the heat assisted switching layer 150 stabilizes the magnetization 131 of the free layer 130 when the free layer 130 is not being switched. This magnetic coupling is uniaxial in nature, allowing the free layer magnetization 131 to be stabilized in the direction that it was written. In a preferred embodiment, the heat assisted switching layer 150 is an antiferromagnetic layer that is exchange coupled to the free layer 130. In such an embodiment, the heat assisted switching layer 150 preferably has a low blocking temperature, of less than two hundred degrees Celsius. The blocking temperature is the temperature at which the exchange coupling between the free layer and the antiferromagnetic heat assisted switching layer 150 reduces to zero. In a preferred embodiment, the heat assisted switching layer 150 is an antiferromagnetic $Ir_{1-x}Mn_x$ layer, where x is at least 0.5. Also in a preferred embodiment, the IrMn layer 150 has a composition close to $Ir_{20}Mn_{80}$. In one embodiment, the thickness of the IrMn layer is between two and ten Angstroms. In one embodiment, the fabrication (composition, thickness, seed layer and deposition conditions) of the heat assisted switching layer 150 is tailored such that the IrMn has a blocking temperature of less than two hundred degrees Celsius and more preferably on the order of one hundred and fifty degrees Celsius. Any AFM layer (not shown) pinning the pinned layer 110 preferably has high blocking temperature (for example greater than two hundred degrees Celsius). Thus, the heat assisted switching layer 150 can stabilize the magnetization 131 of the free layer 130 from thermal fluctuations while the free layer 130 is not being written to, but does not adversely affect writing to the free layer 130.

The spin scattering layer 140 allows the free layer 130 to be written due to spin transfer at a lower write current. The spin scattering layer 140 is configured to more strongly scatter majority electrons exiting the free layer 130 than minority electrons exiting the free layer 130. This scattering aids in reducing the write current for spin transfer, as described below. In a preferred embodiment, the spin scattering layer 140 includes at least two and no more than approximately six Angstroms of Ru or Cr. Note that the spin scattering layer 140 may also reduce, but not eliminate, the magnetic coupling between the free layer 130 and the heat assisted switching layer 150. For example, an exchange coupling between the heat assisted switching layer 150 and the free layer 130 is reduced but not eliminated by the presence of the spin scattering layer 140. In addition to reducing the magnitude of the exchange coupling, the spin scattering layer 140 alters the shape of the curve for the exchange coupling versus temperature. However, the value of the blocking temperature remains relatively constant. Consequently, the heat assisted switching layer 150 can still aid in stabilizing the magnetization 131 of the free layer 130 when the free layer is not being written and the appropriate combination of materials and fabrication conditions can relatively easily be selected.

The spin scattering layer 140 and the heat assisted switching layer 150 aid in improving the thermal stability of the free layer 130, while allowing the free layer 130 to switch states due to spin transfer at a lower write current. The functions of the heat assisted switching layer 150 and the spin scattering layer 140 are described in connection with the operation of the magnetic element 100. Although the ensuing discussion is for an antiferromagnetic layer used for the heat assisted switching layer 150, particularly one including IrMn, analogous principles hold for another layer which has an analogous effect. Similarly, although the following discussion is for between two and six Angstroms of Ru or Cr used as the spin scattering layer 140, similar principles hold for other material(s) having analogous effects. Further, although the discussion above is for between two and six Angstroms of Ru or Cu, in one embodiment, up to eight Angstroms of Ru or Cu can be used.

When the magnetic element 100 is quiescent (not being written to), the magnetic coupling between the heat assisted switching layer 150 and the free layer 130 aids in stabilizing the magnetization 131 in the direction in which the free layer 130 was written. Thus, the thermal stability of the magnetic element 100 is improved. The effect of the exchange coupling between the heat assisted switching layer 150 and the free layer 130 is to increase the uniaxial anisotropy of the free layer 130. Hence the effective energy barrier between the two easy magnetization directions of the free layer 130 is increased significantly. Once written, therefore, the magnetization 131 of the free layer 130 is thus less likely to inadvertently switch directions, for example due to thermal activation.

During writing, the magnetization 131 of the free layer 130 may be switched. During switching, the heat assisted switching layer 150 is heated to a desired temperature, resulting in a loss of exchange coupling. The heat assisted switching layer 150 thus no longer stabilizes the magnetization 131 of the free layer 130. In the preferred embodiment an antiferromagnetic layer, such as IrMn, is used for the heat assisted switching layer 150. IrMn is a preferred antiferromagnetic material because of its low blocking temperature. In such an embodiment, the magnetic element 100 is heated such that the heat assisted switching layer 150 is at least close to, and preferably above, the blocking temperature of the antiferromagnetic layer. Preferably, this heating is accomplished by resistive heating generated by the same current used to switch the magnetization of the free layer 130 through spin transfer. Because the heat assisted switching layer 150 is preferably at or above the blocking temperature of the antiferromagnetic material used, the exchange coupling between the heat assisted switching layer 150 and the free layer 130 goes to zero.

To actually write to the free layer 130, a write current is applied. If the write current is in a downward direction as seen in FIG. 2, the free layer 130 will be written so that the magnetization 131 of the free layer 130 is parallel to the magnetization 111 of the pinned layer 110. In such a case, the electrons travel upward as seen in FIG. 2. Due to spin transfer, majority electrons from the pinned layer 110 tend to transfer their angular momentum to the free layer 130, tending to cause the magnetization 131 of the free layer 130 to be aligned parallel to the magnetization 111 of the pinned layer 110. Furthermore, the spin scattering layer 140 more strongly scatters majority electrons exiting the free layer 130. These majority electrons still have their spins substantially parallel to the magnetization 111 of the pinned layer 110. Consequently, these majority electrons are scattered back to the free layer 130, and have an additional opportunity to transfer their angular momentum to the free layer 130. As a result, the spin transfer becomes more efficient. Consequently, a lower current is required to switch the magnetization 131 of the free layer 130.

If current flows upward (electrons flow downward) as seen in FIG. 2, then the majority electrons are scattered more strongly by the spin scattering layer 140. Minority electrons, in contrast, pass through the free layer 130 and are scattered off of the pinned layer 110. The (reduced) number of majority electrons that pass through the free layer 130 tend not to be scattered by the pinned layer 110. Minority electrons can then return to the free layer 130 and transfer their angular momentum to the free layer 130. This tends to align the magnetization 131 of the free layer 130 antiparallel to the magnetization 111 of the pinned layer 110. Because the majority electrons are more strongly scattered by both the spin scattering layer 140 and the pinned layer 110, the majority electrons are less likely to transfer their angular momentum to the free layer 130. Consequently, the transfer of angular momentum in the desired (minority) direction is enhanced. Again, the write current required to write to the free layer 130 is reduced. Thus, the write current required to align the magnetization 131 of the free layer 130 either parallel or antiparallel to that of the pinned layer 110 is reduced. During writing, therefore, the mechanism which otherwise stabilizes the magnetization 131 of the free layer 130 is broken and the current required to write to the free layer 130 using spin transfer is reduced. The write current for the case of MgO barrier is further reduced compared to alumina barrier because the spin transfer efficiency is dependent on spin polarization. Finally for highly textured MgO based tunneling junctions as described above, the spin polarization is even higher than random textured MgO based tunneling junctions.

When the write current is turned off, preferably in stages, the heat assisted switching layer 150 cools and the magnetization 131 of the free layer 130 is maintained via exchange coupling to the heat assisted switching layer 150. The heat assisted switching layer 150 can thus stabilize the magnetization 131 of the free layer 130 in the direction in which the free layer 130 was written.

During reading, a read current is driven through the magnetic element 100 in the CPP configuration. The read current is preferably significantly less than the write current. As a result, the read current is not sufficient to induce a spin transfer based switching of the magnetization 131 of the free layer 130, will not heat the heat assisted switching layer 140 sufficiently to break the coupling with the free layer 130, and will not inadvertently switch the magnetization of the free layer 130.

More specifically, assume that the heat assisted switching layer 140 is an IrMn layer configured to have a blocking temperature of one hundred fifty degrees Celsius. The critical switching current density, $J_c$, for spin transfer driven magnetization switching can be given as:

$$J_c \propto \alpha M_s t(H_{eff//} + 2\pi M)$$

where $H_{eff//}$ includes anisotropy field ($H_{an}$), exchange ($H_{ex}$) and applied field ($H_{ap}$) aligned along the easy axis of free layer in the film plane. The $4\pi M$ term corresponds to the demagnetizing field, acting perpendicular to the free layer plane. This critical switching current density corresponds to the minimum write current that can be used. Thus, if the critical switching current density is reduced, the write current density and thus the write current can be reduced. If the magnetic element (including an IrMn heat assisted switching layer 150) is heated to a temperature above the blocking temperature (one hundred and fifty degrees Celsius in this case), the magnetization can still be switched at lower spin transfer current value because $H_{ex}$ would be negligible at this temperature. In addition the actual switching current density is lowered because the thermal factor, which is directly related to the energy barrier, is also lowered during writing.

In order to heat the heat assisted switching layer 150 to the desired temperature, resistive heating can be used. In a preferred embodiment, this resistive heating is simply provided by the write current being driven through the magnetic element 100. Note that in an alternate embodiment, another mechanism could be used. For resistive heating, heat generated in the heat assisted switching layer 150 can be estimated assuming a two nanosecond pulse of five hundred millivolts and one milliamp. The resistive heating for configuration such as the magnetic element 100 is then given by:

Heat generated=$V*I*$time=500 mV*1mA*2 nsec=1×10$^{-12}$ J

Effective specific heat of element, including $Ir_{20}Mn_{80}$~0.45 J/g.K

Volume of stack=0.03 μm*0.2 μm*0.2 μm=1.2×10$^{-15}$ cm$^3$

Effective density of top part of stack~9 g/cm$^3$

Temperature Rise=[1×10$^{-12}$]/[(0.45)*(1.2×10$^{-15}$)*(9)] ~200 K

Thus a temperature rise of two hundred Kelvin, or two hundred degrees Celsius, can be achieved. Note that this calculation assumes very good thermal insulation around (sides of) the magnetic element 100. The good thermal insulation may be achieved using standard dielectric materials and by encapsulating (top and bottom) the magnetic element 100 between metal films having relatively poor thermal conductivity. Resistive heating of an adjacent word line (not shown) could also provide heating of the heat assisted switching layer 150. In yet another embodiment, the desired heating of the heat assisted switching layer 150 could be accomplished in another fashion. Thus, the magnetic element 100 may be switched using spin transfer without increasing the current used when the magnetic element 100 undergoes resistive heating. The magnetization 131 of the free layer 130 is also stabilized when the magnetic element is not being written to. The use of the spin scattering layer 140 further reduces the critical current required to switch the magnetization 131 of the free layer 130 and thus reduces the write current required. Furthermore, when the spacer layer 120 is a barrier layer, the resistance and thus the signal for the magnetic element 100 is increased. Consequently, the magnetic element 100 is more thermally stable when it is not being written to, can still be written using spin transfer at a reduced write current, and still have an improved signal.

Figure 3A:
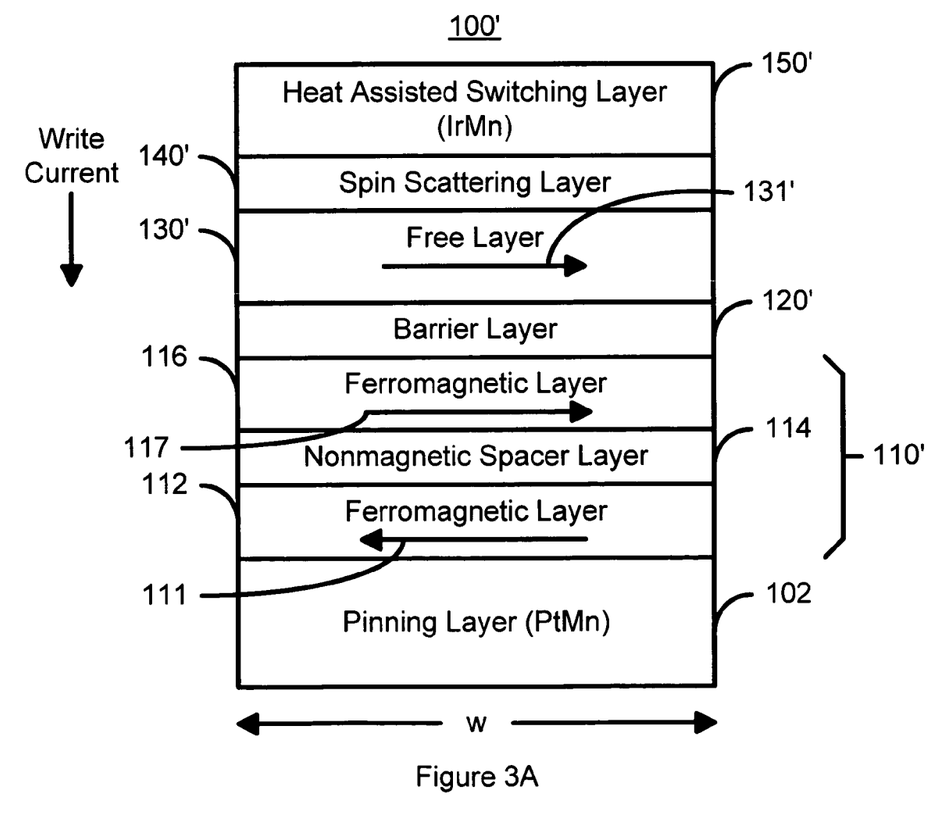
FIG. 3A is a preferred embodiment of a magnetic element in accordance with the present invention utilizing heat assisted switching with a current applied to switch the free layer magnetization.
Figure 3B:
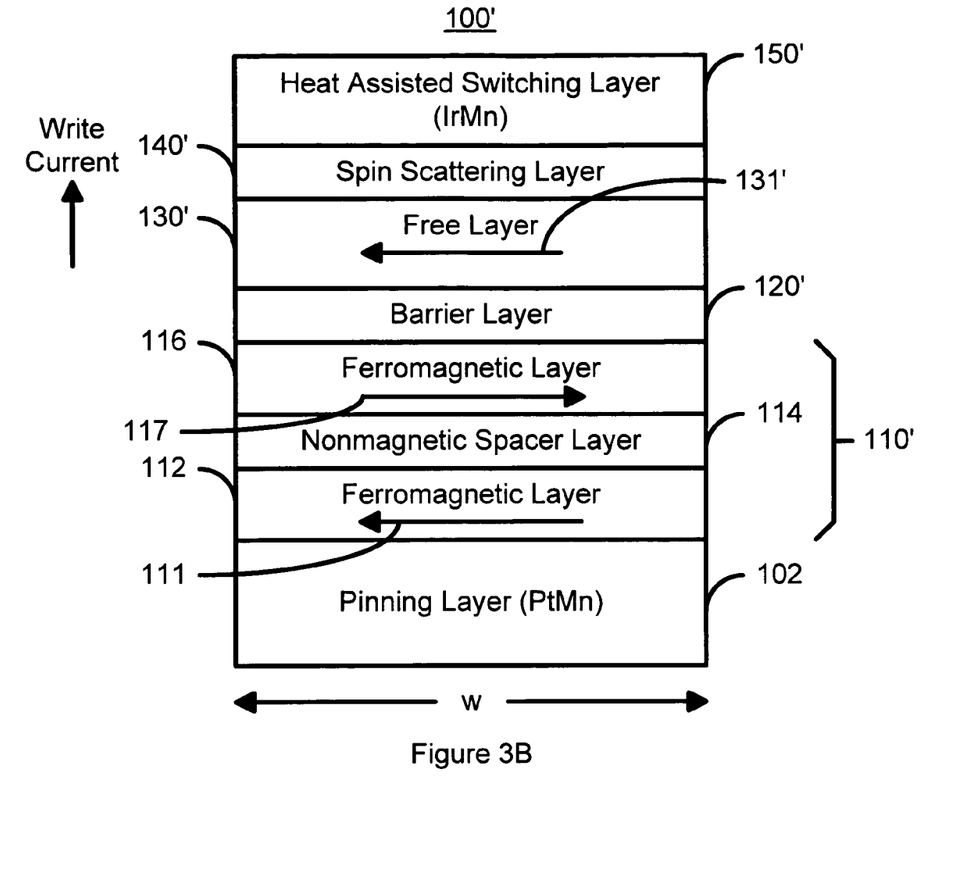
FIG. 3B is the preferred embodiment of a magnetic element in accordance with the present invention utilizing heat assisted switching with a current applied to switch the free layer to have its magnetization antiparallel to the pinned layer.

FIGS. 3A and 3B depict a preferred embodiment of a magnetic element 100' in accordance with the present invention utilizing heat assisted switching with a current applied to switch the free layer magnetization. In FIGS. 3A and 3B, the magnetic element 100' is depicted with a current applied to switch the free layer 130' to have its magnetization parallel and antiparallel, respectively, to the pinned layer 110'. Portions of the magnetic element 100' are analogous to portions of the magnetic element 100 and are, therefore, labeled similarly. Consequently, the magnetic element 100' includes a pinned layer 110', a spacer layer 120', a free layer 130', a spin scattering layer 140', and a heat assisted switching layer 150'. The magnetic element 100' also includes a pinning layer 102 that is used to pin the magnetization 111' of the pinned layer 110' in the desired direction. In addition, the magnetic element 100' generally also includes seed layers (not shown) and capping layers (not shown). Furthermore, the magnetic element 100' is configured such that the free layer 130' can be written using spin transfer. In a preferred embodiment, the lateral dimensions, such as the width w, of the free layer 130' are thus small and preferably less than two hundred nanometers. In addition, some difference is preferably provided between the lateral dimensions to ensure that the free layer 130' has a particular easy axis of magnetization.

The free layer 130' is preferably as described above. Thus, the free layer 130' is ferromagnetic and may be a simple layer that might include a magnetic alloy containing at least one of elements Co, Fe or Ni. In a preferred embodiment, the free layer 130' includes Co, CoFe, CoFeB or a bilayer (layers of the bilayer not separately depicted in FIGS. 3A and 3B) such as NiFe/CoFe. The free layer 130' may be synthetic, for exampling including a trilayer of Co/Ru/Co or CoFe/Ru/CoFe configured such that the magnetic layers are aligned antiparallel. However, in an alternate embodiment, other analogous structures can be used.

In the preferred embodiment 100', the pinned layer 110' is synthetic. The pinned layer 110' thus includes ferromagnetic layers 112 and 116 separated by a nonmagnetic spacer layer 114. The nonmagnetic spacer promotes antiparallel coupling of the ferromagnetic layers. The nonmagnetic spacer layer 114 is preferably Ru. In a preferred embodiment, the ferromagnetic layers 112 and 116 include Co, CoFe, or CoFeB. The pinned layer 110' is also configured such that the magnetizations of the ferromagnetic layers 112 and 116 are aligned antiparallel.

The pinning layer 102 is preferably an antiferromagnetic layer having a high blocking temperature. In a preferred embodiment, the pinning layer 102 includes PtMn and is fabricated to have a blocking temperature in excess of two hundred degrees Celsius.

The spacer layer 120' is nonmagnetic. In one embodiment, the spacer layer 120' may be conductive, for example including Cu. However, such an embodiment would have a lower resistance and, therefore, a lower signal. Consequently, as described above, the spacer layer 120' is preferably a barrier layer including an insulator such as alumina. In such an embodiment, the barrier layer 120' is less than two nanometers thick such that charge carriers can tunnel between the free layer 130' and the pinned layer 110'.

The spin scattering layer 140' is configured to more strongly scatter majority electrons than minority electrons. Consequently, in a preferred embodiment, the spin scattering layer 140' includes at least approximately two Angstroms of Ru or Cr and not more than approximately six Angstroms of Ru or Cr.

The heat assisted switching layer 150' is configured such that the magnetization 131' of the free layer 130' is stabilized when the free layer 130' is not being switched. In a preferred embodiment, the heat assisted switching layer 150' is an antiferromagnetic layer that is exchange coupled to the free layer 130'. In such an embodiment, the heat assisted switching layer 150' preferably has a low blocking temperature, less than two hundred degrees Celsius, and preferably on the order of one hundred and fifty degrees Celsius. In a preferred embodiment, the heat assisted switching layer 150' is an antiferromagnetic $Ir_{1-x}Mn_x$ layer, where x is preferably at least 0.5. Also in a preferred embodiment, the IrMn heat assisted switching layer 150' has a composition close to $Ir_{20}Mn_{80}$. Preferably, the fabrication (composition, thickness, seed layer and deposition conditions) of the heat assisted switching layer 150' is tailored such that the IrMn has a blocking temperature on the order of one hundred and fifty degrees Celsius.

The heat assisted switching layer 150' and the spin scattering layer 140' act in substantially the same manner as the heat assisted switching layer 150 and spin scattering layer 140, respectively, depicted in FIG. 2 and described above. Referring back to FIGS. 3A and 3B, the heat assisted switching layer 150' aids in stabilizing the magnetization 131' of the free layer 130' in the direction in which the free layer 130' was written when the free layer 130' is being not switched. Thus, the thermal stability of the magnetic element 100' is improved. However, during switching of the magnetization 131' of the free layer 130', the heat assisted switching layer 150' is heated to a temperature at which the heat assisted switching layer 150' no longer stabilizes the magnetization 131' of the free layer 130'. Stated differently, the magnetic element 100' is preferably heated to or above the blocking temperature of the heat assisted switching layer 150' to reduce the exchange coupling between the heat assisted switching layer 150' and the free layer 130' to zero. Moreover, in a preferred embodiment, the blocking temperature of the IrMn heat assisted switching layer 150' is significantly less than the blocking temperature of the PtMn pinning layer 102. As a result, the coupling between the ferromagnetic layer 112 of the pinned layer 110' and the pinning layer 102 is not substantially reduced during switching of the magnetization 131' of the free layer 130'. In addition, the spin scattering layer 140' scatters majority electrons, thereby enhancing spin transfer induced switching of the magnetic element 100'. Consequently, the magnetic element 100' is more thermally stable when it is not being written to, and can be written using spin transfer occurring at a lower write current.

For example, FIG. 3A depicts the magnetic element 100' when the magnetization 131' of the free layer 130' is switched to be parallel to the ferromagnetic layer 116. Current is driven in the downward direction as depicted in FIG. 3A. Consequently, electrons flow from the ferromagnetic layer 116 to the free layer 130'. The majority electrons are spin polarized in the direction of the magnetization 117 of the pinned layer 116. These majority electrons may transfer angular momentum to the free layer 130'. In addition, majority electrons from the free layer 130' are more strongly scattered from the spin scattering layer 140' back to the free layer 130'. These majority electrons may also transfer angular momentum to the free layer 130'. The majority electrons directly from the pinned layer 110' and scattered from the spin scattering layer 140' may transfer sufficient angular momentum to the free layer 130' to flip the magnetization 131' of the free layer 130' to be parallel to the magnetization 117 of the pinned layer 116. Thus, the magnetization 131' of the free layer 130' is switched to (or remains in if the magnetizations 131' and 117 had previously been parallel) be parallel to the magnetization 117. Moreover, this switching is not substantially adversely affected by any magnetic coupling between the free layer 130' and the heat assisted switching layer 150' because heating has brought the heat assisted switching layer 150' close enough to, or even above, its blocking temperature. Also in a preferred embodiment, this heating is due to resistive heating from the write current or, in an alternate embodiment, a nearby conductive line. In an alternate embodiment, this heating may be provided in another fashion.

Alternatively, FIG. 3B depicts the magnetic element 100' when the magnetization 131' of the free layer 130' is switched to be antiparallel to the ferromagnetic layer 116. Current is driven upward as depicted in FIG. 3B. Thus, electrons travel downward. Majority electrons are scattered by the spin scattering layer 140', while minority electrons are transmitted through the free layer 130' and allowed to transfer at least a portion of their angular momentum to the free layer 130'. Thus, a larger portion of the angular momentum transferred to the free layer 130' by electrons traveling from the spin scattering layer 140' is due to minority electrons having their spins aligned in the direction to which the free layer magnetization 131' is desired to be switched. Furthermore, if the magnetization 131' of the free layer 130' had previously been aligned parallel to the magnetization 117 of the ferromagnetic layer, the majority electrons are transmitted by the ferromagnetic layer 116. However, minority electrons (having their spins aligned antiparallel to the magnetizations of the free layer 130' and the ferromagnetic layer 116) are reflected. The combination of the reflected electrons and the minority electrons initially passing through the free layer 130' may transfer sufficient angular momentum to switch the magnetization of the free layer 131' to be antiparallel to the magnetization 117 of the ferromagnetic layer 116, as shown in FIG. 3B. Furthermore, this switching may occur at a lower current. Thus, the magnetization 131' of the free layer 130' is switched to (or remains in if the magnetizations 131' and 117 had previously been antiparallel) be antiparallel to the magnetization 117.

Thus, the magnetic element 100' may be more stable when not being written to due to the presence of the heat assisted switching layer 150'. Furthermore, the magnetic element 100' may be switched due to spin transfer at a lower write current. Consequently, performance of the magnetic element 100' is improved.

Figure 4A:
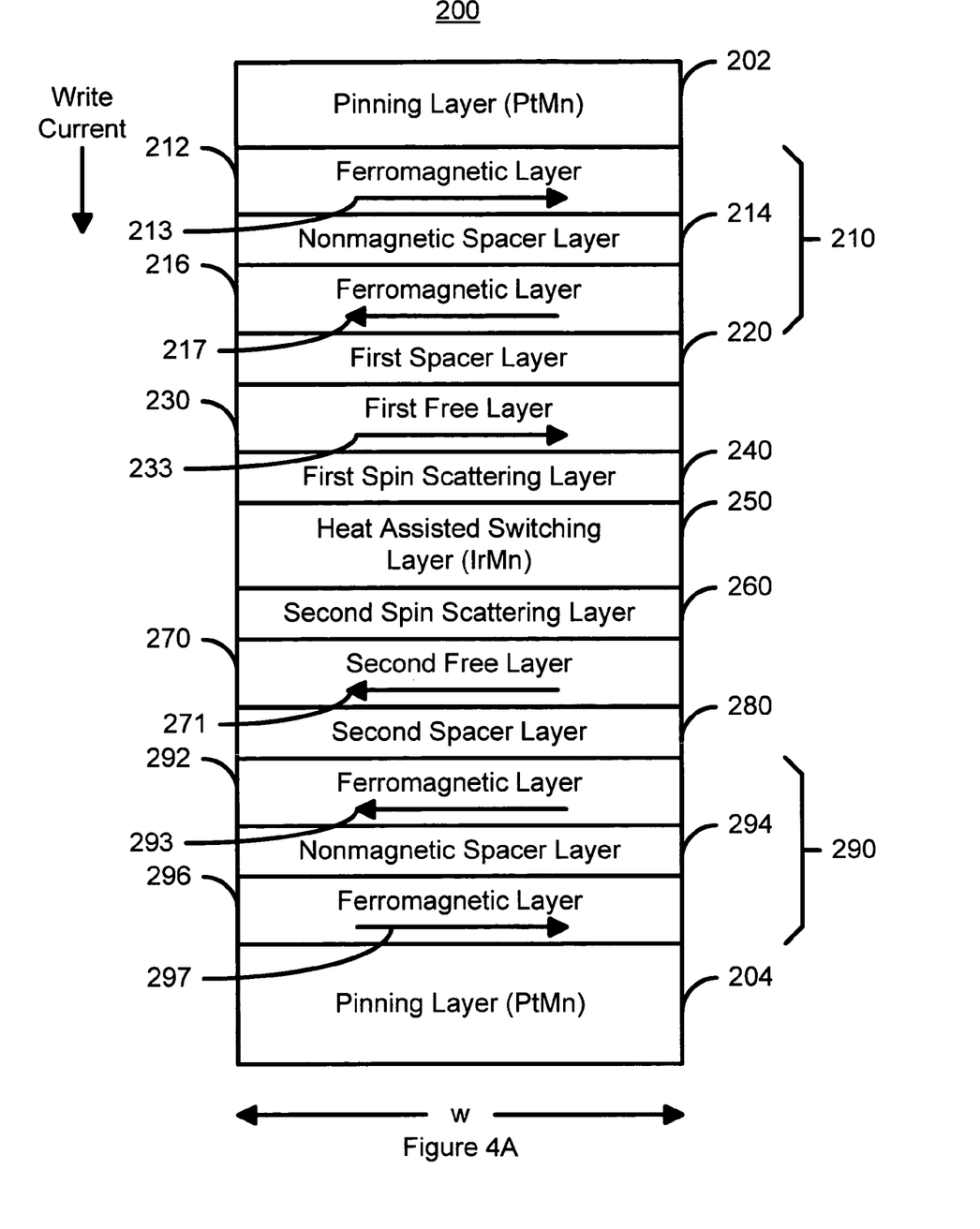
FIG. 4A is another embodiment of a magnetic element in accordance with the present invention utilizing heat assisted switching with a current applied to switch the free layer to have its magnetization parallel to the pinned layer.
Figure 4B:
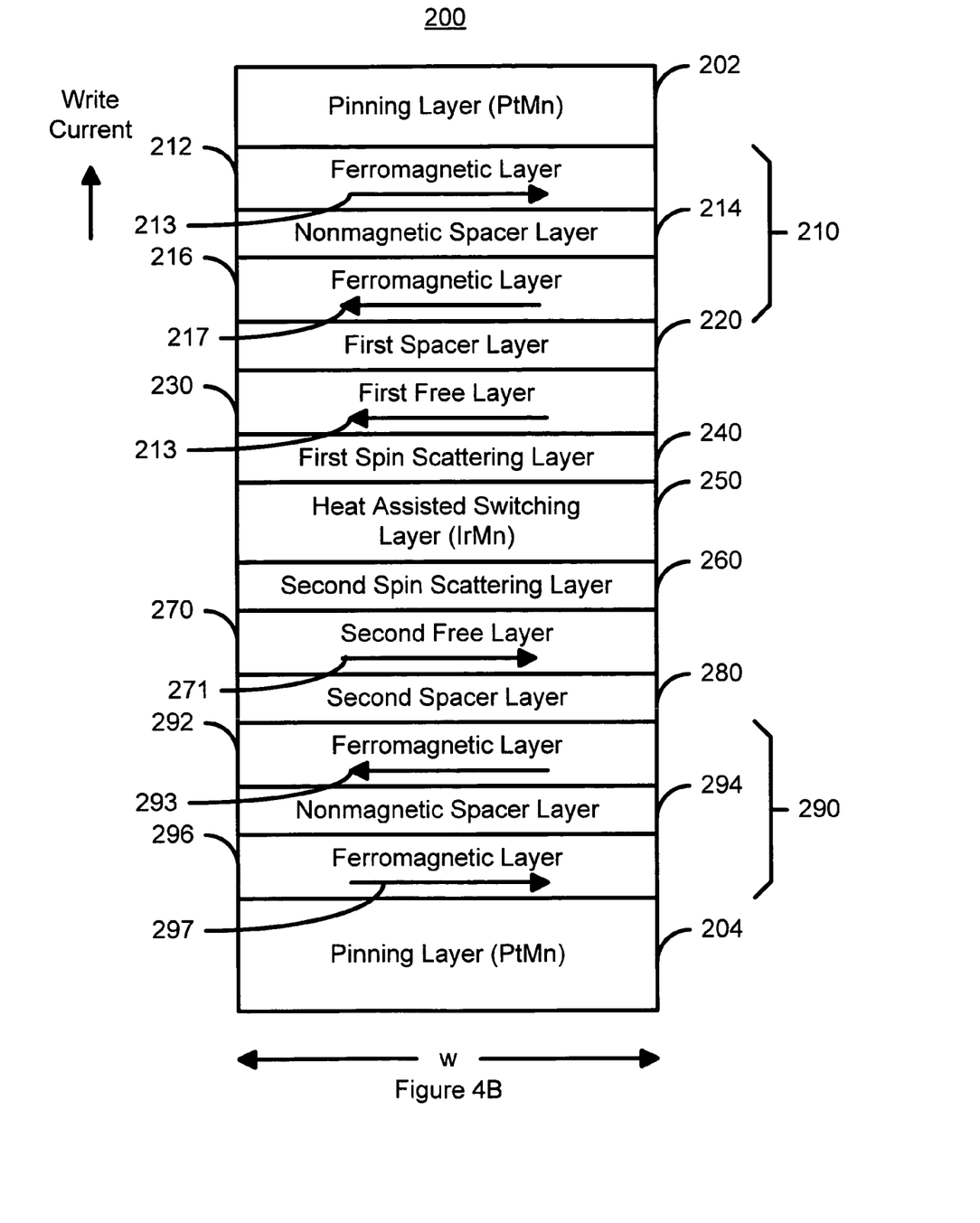
FIG. 4B is the other embodiment of a magnetic element in accordance with the present invention utilizing heat assisted switching with a current applied to switch the free layer to have its magnetization antiparallel to the pinned layer.

FIGS. 4A and 4B depict another embodiment of a magnetic element 200 in accordance with the present invention utilizing heat assisted switching with a current applied to switch the free layer to have its magnetization parallel and antiparallel, respectively, to the pinned layer. The magnetic element 200 includes a first pinning layer 202, a first pinned layer 210, a first spacer layer 220, a first free layer 230, a first spin scattering layer 240, a heat assisted switching layer 250, a second spin scattering layer 260, a second free layer 270, a second spacer layer 280, a second pinned layer 290, and a second pinning layer 204. Thus, the magnetic element 200 can be considered to include two structures, each of which is analogous to the magnetic element 100, but which share the heat assisted switching layer 250. The first free layer 230 and the second free layer 270 are magnetostatically coupled, preferably so that the magnetization 231 of the first free layer 230 is antiparallel to the magnetization 271 of the second free layer 270. The magnetic element 200 is also configured such that at least the first free layer 230, and preferably also the second free layer 270, can be switched using spin transfer. In a preferred embodiment, the lateral dimensions, such as the width w, of the first free layer 230 are thus small and preferably less than two hundred nanometers. In addition, some difference is preferably provided between the lateral dimensions to ensure that the first free layer 230 has a particular easy axis. In a preferred embodiment, in which spin transfer is also used for switching the second free layer 270, the size and dimensions of the second free layer 270 are substantially the same as the first free layer 230.

The free layers 230 and 270 are preferably each analogous to the free layer 130 and can be made of substantially the same materials. Thus, the free layer 230 and/or the free layer 270 may be simple, a bilayer, synthetic, or have another structure as previously described. Also in a preferred embodiment, the free layers 230 and 270 are magnetostatically coupled to have their magnetizations 231 and 271, respectively, antiparallel. Also in a preferred embodiment, the free layers 230 and 270 as well as the heat assisted switching layer 250 are configured to optimize this magnetostatic coupling.

The pinned layers 210 and 290 are preferably synthetic. The pinned layer 210 thus preferably includes ferromagnetic layers 212 and 216 separated by a nonmagnetic spacer layer 214 which promotes anti-ferromagnetic coupling of the ferromagnetic layers 212 and 216, respectively. Similarly, the pinned layer 290 preferably includes ferromagnetic layers 292 and 296 separated by a nonmagnetic spacer layer 294 which promotes anti-ferromagnetic coupling of the ferromagnetic layers 292 and 296, respectively. The pinned layers 210 and 270 preferably include magnetic alloys containing at least one of elements Co, Fe or Ni. In a preferred embodiment, the composition of each of the pinned layers 210 and 270 includes Co, CoFe, or CoFeB.

The pinning layers 202 and 284 are preferably antiferromagnetic layers 202 and 204. The antiferromagnetic layers 202 and 204 are preferably IrMn, PtMn or PtMnCr. Blocking temperatures of the pinning layers 202 and 204 are preferably greater than the blocking temperature of the heat assisted switching layer 250 or other temperature(s) at which the magnetic coupling between the free layers 230 and 270 and the heat assisted switching layer 250 goes to zero.

The spacer layers 220 and 280 are nonmagnetic and, as discussed above, may be tunneling barrier layers. However, one or more of the spacer layers 220 and 280 could also be conductive layers, insulating tunneling layers or insulating layers having ferromagnetic conductive channels. The spacer layers 220 and 280 may have different properties. In one embodiment, the first spacer layer 220 is conductive, for example including Cu, while the spacer 280 is an insulating barrier layer. Thus, the first pinned layer 210, the first spacer layer 220 and the first free layer 230 function as a spin valve. In such an embodiment, the second spacer layer 280 may be insulating or is otherwise configured to have a higher resistance when a read current is passed through the magnetic element 200. In such an embodiment, the second spacer layer 260 might a tunneling barrier layer including an insulator such as alumina or $MgO_x$. The lower portion of the magnetic element 200 including the second free layer 250, the second spacer layer 260, and the second pinned layer 270 would, therefore, function as a spin tunneling junction. In case of MgOx barrier, even better spin transfer performance can be achieved if there exists an orientation relationship between the preferably three highly perpendicular textured layers—the pinned layer (in case of synthetic pinned layer, the sub-layer closest to the barrier), the barrier layer and the free layer closest to the barrier. The relationship is pinned layer BCC-(001)/MgO Cubic-(001)/free layer BCC-(001). In another embodiment, the second spacer layer 260 might be a ballistic magnetoresistance (BMR) spacer. In addition, the BMR spacer generally precludes the second free layer 270 from being switched using spin transfer due to electrons from or reflected by the pinned layer 290. In such an embodiment, the BMR spacer 280 would include a ferromagnetic alloy containing at least one of the elements Co, Fe or Ni embedded in an insulating matrix of $SiO_2$ or SiC, such that the ferromagnetic material forms at least one channel (not explicitly shown) extending through the length (from top to bottom as shown in FIGS. 4A and 4B) of the second spacer layer 280. The channel width is preferably between one three nanometers and of such a length (same as thickness of the spacer) so as to allow ballistic transport of electrons. The channel also serves as site for location of sharp domain wall, when the magnetization directions of the layer at its two ends are anti-parallel. In this embodiment, the second spacer 280 would be optimized to obtain high ballistic magneto-resistance.

The heat assisted switching layer 250 is configured such that the magnetization 231/271 of the free layers 230/270 respectively, is stabilized when the free layers 230/270 is not being switched. In a preferred embodiment, the heat assisted switching layer 250 is an antiferromagnetic layer that is exchange coupled to the free layers 230/270. In such an embodiment, the heat assisted switching layer 250 preferably has a low blocking temperature, on the order of two hundred degrees Celsius or less and is preferably approximately one hundred and fifty degrees Celsius. As a result, the exchange coupling between the heat assisted switching layer 250 and the free layers 230/270 can be driven to zero at a relatively low temperature. In a preferred embodiment, the heat assisted switching layer 250 is an antiferromagnetic $Ir_xMn_{1-x}$ layer, where x is less than 0.5. Also in a preferred embodiment, the IrMn layer 250 has a composition close to $Ir_{20}Mn_{80}$. Preferably, the fabrication (composition, thickness, seed-layer and deposition conditions) of the heat assisted switching layer 250 is tailored such that the IrMn has a blocking temperature on the order of one hundred and fifty degrees Celsius. In one embodiment, the blocking temperature of the heat assisted switching layer 250 is preferably less than the blocking temperature of the pinning layers 202 and 204. Furthermore, the heat assisted switching layer 250 in combination with the spin scattering layers 240 and 260 are configured such that the free layers 230 and 270 are magnetostatically coupled. The combined thickness of the heat assisted switching layer 250 and the spin scattering layers 240 and 260 is preferably configured to provide a significant, antiparallel coupling between the first free layer 230 and the second free layer 270.

The spin scattering layers 240 and 260 are configured to more strongly scatter majority electrons than minority electrons passing through the free layer 230 and 270, respectively. Consequently, the spin scattering layers 240 and 260 each preferably include at least about two Angstroms and preferably not more than six Angstroms of Ru or Cr. The spin scattering layers 240 and 260 function as described above for the spin scattering layers 140 and 140'. Thus, the spin scattering layers 240 and 260 allow a lower write current to be used when switching the magnetic element 200 using spin transfer. In addition, note that one of the spin scattering layers 240 or 260 might be omitted. This is particularly true if the corresponding free layer 230 or 270 is not written using spin transfer.

When the magnetic element 200 is not being written to, the heat assisted switching layer 250 aids in stabilizing the magnetization 231 of the first free layer 230 in the direction in which the first free layer 230 was written. Because the free layers 230 and 270 are strongly magnetostatically coupled, the magnetization 271 of the second free layer 270 is also stabilized in an antiparallel configuration (magnetization 271 antiparallel to the magnetization 231). Thus, the thermal stability of the magnetic element 200 is improved. In the preferred embodiment, this stabilization is accomplished because the antiferromagnetic material in the heat assisted switching layer 250 is exchange coupled to the free layer 230 and 270. Note that the heat assisted switching layer 250 may also aid in stabilizing the magnetization 271 of the free layer 270 in an analogous fashion.

During writing, the magnetization 231/271 of the free layer 230/270 may be switched. The desired configuration is that in which the free layer 230 switches primarily by spin transfer. During switching, the heat assisted switching layer 250 is heated to a desired temperature and thus no longer stabilizes the magnetization 231 of the free layer 230. In the preferred embodiment an antiferromagnetic layer, such as IrMn, is used for the heat assisted switching layer 250. IrMn is a preferred antiferromagnetic material because its low blocking temperature can be adjusted by changing its thickness. The magnetic element 200 is heated such that the heat assisted switching layer 250 is at least close to, and preferably above, the blocking temperature of the antiferromagnetic layer, thereby driving the exchange coupling with the free layers 230 and 270 to zero. Preferably, this heating is accomplished by resistive heating generated by the same current used to switch the magnetization of the free layer 230 through spin transfer. Such resistive heating is described above with respect to the magnetic element 100 depicted in FIG. 2. Referring back to FIGS. 4A and 4B, because the heat assisted switching layer 250 is preferably at or above the blocking temperature of the antiferromagnetic material used for the heat assisted switching layer 250, the exchange coupling between the heat assisted switching layer 250 and the free layers 230 and 270 may be broken. In addition, use of the spin scattering layers 240 and 260 allows for enhancement of the spin transfer effect for the free layers 230 and 270. When current is driven down and electrons travel up (FIG. 4A), the spin scattering layer 240 scatters majority electrons traveling toward the free layer 230 and, therefore, enhances the spin transfer due to minority electrons reflecting from the pinned layer 210. When current is driven up and electrons travel down (FIG. 4B, the spin scattering layer 240 reflects majority electrons back up to the free layer 230 to have an additional opportunity to transfer their angular momentum to the free layer 230 and enhance spin transfer. Thus, the magnetization 231 of the free layer 230 may be switched using a lower current. Furthermore, because of the magnetostatic coupling between the free layers 230 and 270, a change in the direction of magnetization of the free layer 230 causes a change in the direction of magnetization of the second free layer 270. Thus, the magnetization 271 of the free layer 270 can also change direction. Furthermore, if the spin scattering layer 260 is used, when current is driven down and electrons travel up (FIG. 4A), the spin scattering layer 240 reflects majority electrons back to the free layer 270 to have an additional opportunity to transfer their angular momentum to the free layer 270 and enhance spin transfer. When current is driven up and electrons travel down (FIG. 4B), the spin scattering layer 260 scatters majority electrons traveling toward the free layer 270 and, therefore, enhances the spin transfer due to minority electrons reflecting from the pinned layer 290.

In addition, because of the use of the low blocking temperature IrMn, the temperature to which the magnetic element 200 is heated is below the blocking temperature of the pinning layers 202 and 204. The pinned layers 210 and 290 are, therefore, substantially unaffected by the heating during switching. When the write current is turned off, the heat assisted switching layer 250 cools and the magnetizations 231/271 of the free layers 230/270 are maintained. The heat assisted switching layer 250 can then stabilize the magnetization 231 of the free layer 230 in the new direction. Because of the magnetostatic coupling between the free layers 230 and 270, the magnetization 271 of the free layer 270 is also stabilized. Thus, the magnetic element 200 can be written at a lower current, while the thermal stability of the magnetic element is improved.

During reading, a read current is driven through the magnetic element 200. The read current is low enough that it does not heat the heat assisted switching layer 250 sufficiently to break the coupling with the free layer 230 and will not inadvertently switch the magnetization of the free layer 230. Furthermore, when the spacer layer 220 is a barrier layer, the resistance and thus the signal for the magnetic element 200 is increased. Consequently, the magnetic element 200 is more thermally stable when it is not being written to, can be written using spin transfer at a lower write current, and still have an improved signal.

Figure 5:
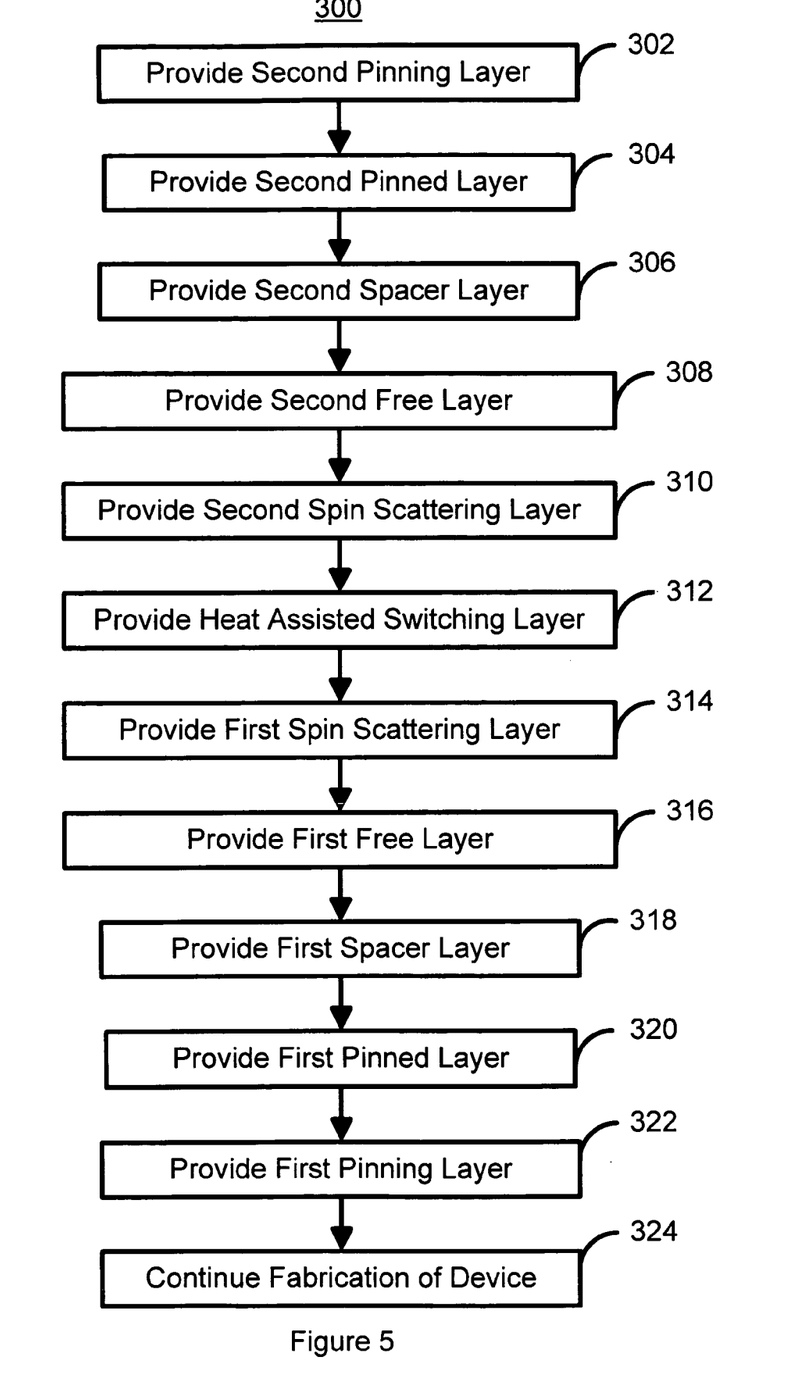
FIG. 5 is a high-level flow chart depicting one embodiment of a method in accordance with the present invention for fabricating a magnetic element in accordance with the present invention utilizing heat assisted switching.

FIG. 5 is a high-level flow chart depicting one embodiment of a method 300 in accordance with the present invention for fabricating a magnetic element in accordance with the present invention utilizing heat assisted switching. For clarity, the method 300 is described in the context of the magnetic element 200. However, the method 300 could be used for other magnetic elements, such as the magnetic element 100 and 100'. However, some steps would be omitted. Moreover, although the method 300 is described primarily in the context of a single magnetic element, one of ordinary skill in the art will readily recognize that multiple magnetic elements may be fabricated substantially simultaneously. The second pinning layer 204 is provided, via step 302. The second pinned layer 290 is provided, via step 304. In one embodiment, step 304 includes providing a synthetic pinned layer. The second spacer layer 280 is provided, via step 306. The second spacer layer 280 may be insulating or conductive. The second free layer 270 is provided, via step 308. Step 308 may thus include providing a synthetic free layer. The second spin scattering layer 270 is provided, via step 310. Step 310 preferably includes depositing at least approximately two Angstroms and less than or equal to about six Angstroms of Ru or Cr. The heat assisted switching layer 250 is provided, via step 312. Step 312 may thus include providing an IrMn layer configured to have a low blocking temperature of approximately one hundred and fifty degrees Celsius. If the magnetic element 100 or 100' were being formed, then fabrication of the magnetic element itself would cease and other structures, such as the terminals, may be formed. For the magnetic element 200, however, the spin scattering layer 240 is provided, via step 314. In one embodiment, step 314 includes depositing at least approximately two Angstroms and less than or equal to about six Angstroms of Ru or Cr. The first free layer 230 is provided, via step 316. Step 316 may thus include providing a synthetic free layer. The spacer layer 220 is provided, via step 318. The first spacer layer 220 is preferably conductive. The first pinned layer 210 is provided, via step 320. In one embodiment, step 320 includes providing a synthetic pinned layer. The first pinning layer 202 is provided, via step 322. Formation of the magnetic memory may be continued, via step 324.

Thus, using the method 300, or a portion thereof, the magnetic elements 100, 100', and/or 200 can be fabricated. Thus, magnetic elements having a lower spin transfer based switching current and that have improved stability against thermal fluctuations can be provided.

Figure 6:
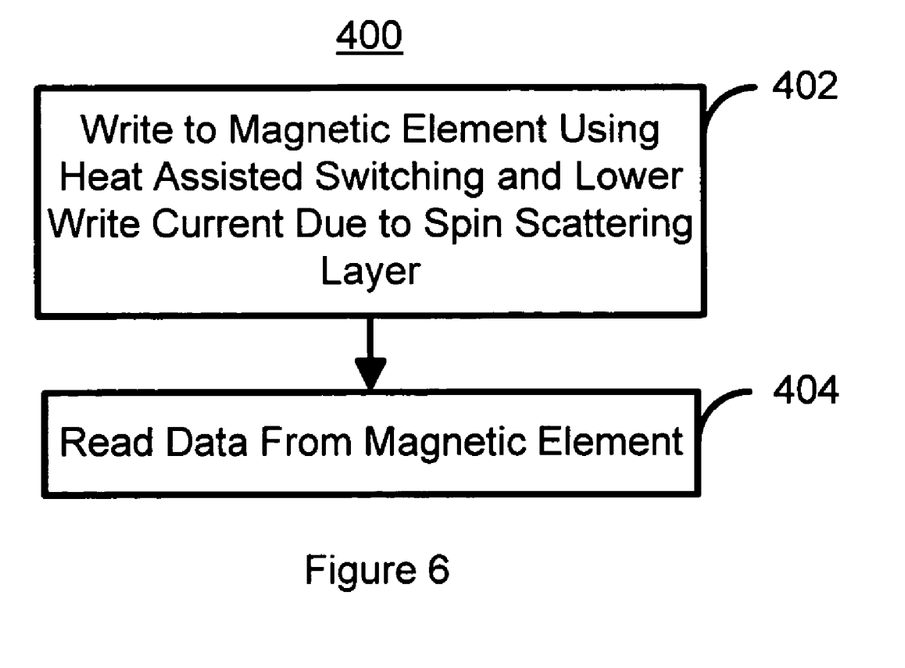
FIG. 6 is a high-level flow chart depicting one embodiment of a method in accordance with the present invention for using a magnetic element in accordance with the present invention utilizing heat assisted switching.

FIG. 6 is a high-level flow chart depicting one embodiment of a method 400 in accordance with the present invention for using to a magnetic element in accordance with the present invention utilizing heat assisted switching. For clarity, the method 400 is described in the context of the magnetic element 200. However, the method 250 could be used for other magnetic elements, such as the magnetic element 100 and/or 100'. Moreover, although the method 400 is described primarily in the context of a single magnetic element, one of ordinary skill in the art will readily recognize that multiple magnetic elements may be read or written in parallel. The magnetic element 200 is written using heat assisted switching and at a lower write current due to the spin scattering layer 240 and, potentially, 260, via step 402. Note that in a magnetic memory (not explicitly shown), step 402 could include writing a number of magnetic elements. Step 402 thus includes heating the heat assisted switching layer 250 to the desired temperature to break the coupling between the heat assisted switching layer 250 and the free layers 230 and 270 as well as driving a current through the magnetic element 200 to write using spin transfer. In addition, the heating step performed using step 402 is configured to leave the properties of the remaining portion of the magnetic element 200 (other than the heat assisted switching layer 250) substantially unchanged. For example for the magnetic element 200', the heating would keep the temperatures of the pinning layers 202 and 204 below their blocking temperatures to ensure that the exchange coupling between the pinning layers 202 and 204 and the pinned layers 210 and 290 is note reduced to zero. In a preferred embodiment, the heating and current driving of step 402 occur together, by driving the write current for the desired time. Stated differently, the heating of step 402 is accomplished by resistive heating due to the write current driven in step 402. In a preferred embodiment, a write current driven in step 402 accomplishes both heating and providing a sufficient (and lower) write current for writing to the magnetic element 200. In one embodiment, step 402 includes reducing the write current, for example in a stepped or linear fashion. However, in another embodiment, the write current can simply be removed abruptly. At some later time, the magnetic element 200 is read, via step 404. Step 404 includes driving a read current through the desired portion of the magnetic element 200. In addition, the write current driven in step 404 is preferably significantly less than the write current. In a preferred embodiment, the read current driven in step 404 is not high enough to heat the heat assisted switching layer 240 to at, near, or above its blocking temperature. Stated differently, the read current is preferably not sufficiently high to substantially adversely affect the ability of the heat assisted switching layer to stabilize the magnetizations 231 and 271 of the free layers 230 and 270, respectively. Thus, the magnetic element 200 may be written to using a smaller write current and read while the magnetic element 200 has improved thermal stability.

A method and system for providing a magnetic element that is more thermally stable and capable of being written using a lower current density have been disclosed. The present invention has been described in accordance with the embodiments shown, one of ordinary skill in the art will readily recognize that there could be variations to the embodiments, and any variations would be within the spirit and scope of the present invention. Software written according to the present invention is to be stored in some form of computer-readable medium, such as memory, CD-ROM or transmitted over a network, and executed by a processor. Consequently, a computer-readable medium is intended to include a computer readable signal which, for example, may be transmitted over a network. Accordingly, many modifications may be made by one of ordinary skill in the art without departing from the spirit and scope of the appended claims.

We claim:

1. A magnetic element comprising:
   a pinned layer;
   a spacer layer, the spacer layer being nonmagnetic;
   a free layer, the spacer layer residing between the pinned layer and the free layer;
   a spin scattering layer, the free layer residing between the spin scattering layer and the spacer layer, the spin scattering layer being configured to more strongly scatter majority electrons than minority electrons;
   a heat assisted switching layer, the spin scattering layer residing between the free layer and the heat assisted switching layer, the heat assisted switching layer for improving a thermal stability of the free layer when the free layer is not being switched;
   wherein the magnetic element is configured to allow the free layer to be switched due to spin transfer when a write current is passed through the magnetic element.

2. The magnetic element of claim 1 wherein the heat assisted switching layer is an antiferromagnetic layer having an exchange coupling to the free layer.

3. The magnetic element of claim 1 wherein the antiferromagnetic layer is configured to have a blocking temperature that is less than or equal to a temperature of the antiferromagnetic layer when the free layer is being switched.

4. The magnetic element of claim 2 wherein the antiferromagnetic layer has a blocking temperature of not greater than two hundred degrees Celsius.

5. The magnetic element of claim 2 wherein the antiferromagnetic layer includes IrMn.

6. The magnetic element of claim 2 wherein the spin scattering layer reduces the exchange coupling between the antiferromagnetic layer and the free layer to below an adjacent exchange coupling occurring when the free layer is immediately adjacent to the antiferromagnetic layer.

7. The magnetic element of claim 2 wherein the spin scattering layer includes at least one of Ru and Cr.

8. The magnetic element of claim 7 wherein the spin scattering layer has a thickness of less than or equal to ten Angstroms.

9. The magnetic element of claim 8 wherein the spin scattering layer has a thickness of less than or equal to six Angstroms and at least two Angstroms.

10. The magnetic element of claim 2 further comprising:
    a pinning layer adjacent to the pinned layer and including an antiferromagnetic material, the pinned layer between the pinning layer and the spacer layer, the antiferromagnetic material having a second blocking temperature greater than a temperature of the magnetic element during writing.

11. The magnetic element of claim 1 wherein the spacer layer further includes a tunneling barrier layer including at least one of AlOx or MgOx.

12. The magnetic element of claim 1 wherein the spacer layer further includes a conductive nonmagnetic layer.

13. The magnetic element of claim 1 wherein the pinned layer further includes a first ferromagnetic layer, a second ferromagnetic layer, and a conductive nonmagnetic spacer layer between the first ferromagnetic layer and the second ferromagnetic layer, the conductive nonmagnetic spacer layer, the first ferromagnetic layer, and the second ferromagnetic layer being configured such that the first ferromagnetic layer and the second ferromagnetic layer are antiferromagnetically coupled.

14. The magnetic element of claim 1 wherein the free layer further includes at least one of elements Co, Fe and Ni.

15. The magnetic element of claim 14 wherein the free layer includes at least one of Co, CoFe, and NiFe.

16. The magnetic element of claim 14 wherein the free layer is a bilayer.

17. The magnetic element of claim 1 The magnetic element of claim 1 wherein the free layer further includes a first ferromagnetic layer, a second ferromagnetic layer, and a conductive nonmagnetic spacer layer between the first ferromagnetic layer and the second ferromagnetic layer, the conductive nonmagnetic spacer layer, the first ferromagnetic layer, and the second ferromagnetic layer being configured such that the first ferromagnetic layer and the second ferromagnetic layer are antiferromagnetically coupled.

18. A magnetic element comprising:
a pinned layer;
a spacer layer, the spacer layer being nonmagnetic;
a free layer, the spacer layer residing between the pinned layer and the free layer;
a spin scattering layer, the free layer residing between the spin scattering layer and the spacer layer, the spin scattering layer including Ru and being not more than six Angstroms thick;
a heat assisted switching layer including an antiferromagnet having a blocking temperature less than a temperature of the heat assisted switching layer when a write current is passed through the heat assisted switching layer, the spin scattering layer residing between the free layer and the heat assisted switching layer;
wherein the magnetic element is configured to allow the free layer to be switched due to spin transfer when the write current is passed through the magnetic element.

19. A magnetic element comprising:
a first pinned layer;
a first spacer layer, the first spacer layer being nonmagnetic;
a first free layer, the first spacer layer residing between the first pinned layer and the first free layer;
a first spin scattering layer, the first free layer residing between the first spin scattering layer and the first spacer layer, the first spin scattering layer being configured to scatter first majority electrons from the first free layer more strongly than first minority electrons from the first free layer;
a heat assisted switching layer, the first free layer residing between the first spacer layer and the heat assisted switching layer, the heat assisted switching layer for improving a thermal stability of the first free layer when the first free layer is not being switched, the heat assisted switching layer is at least two nanometers thick;
a second spin scattering layer, the heat assisted switching layer residing between the first spin scattering layer and the second spin scattering layer;
a second free layer, the second spin scattering layer residing between the heat assisted switching layer residing and the first free layer, the first free layer and the second free layer being magnetostatically coupled, the second spin scattering layer being configured to scatter second majority electrons from the second free layer more strongly than second minority electrons from the second free layer;
a second spacer layer, the second spacer layer being nonmagnetic;
a second pinned layer, the second spacer layer residing between the second free layer and the second pinned layer;
wherein the magnetic element is configured to allow the first free layer to be switched due to spin transfer when a write current is passed through the magnetic element.

* * * * *